(12) United States Patent
Joshi

(10) Patent No.: US 6,864,810 B2
(45) Date of Patent: Mar. 8, 2005

(54) CONVERTING DIGITAL SIGNALS

(75) Inventor: Mayur Joshi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/625,693

(22) Filed: Jul. 24, 2003

(65) Prior Publication Data
US 2005/0017880 A1 Jan. 27, 2005

(51) Int. Cl.[7] .............................................. H03M 7/00
(52) U.S. Cl. ............................ 341/50; 369/49; 711/106
(58) Field of Search .................................. 341/155, 158, 341/159, 160, 50; 326/41, 101, 102, 105, 106; 365/49, 230.06; 711/108, 202; 716/8–16; 257/208, 390

(56) References Cited

U.S. PATENT DOCUMENTS

| 4,928,260 | A | | 5/1990 | Chuang et al. |
| 5,418,923 | A | * | 5/1995 | Mihara et al. ............... 711/108 |
| 5,557,275 | A | * | 9/1996 | van Valburg et al. ....... 341/160 |
| 6,028,452 | A | * | 2/2000 | Benschneider ............... 326/106 |
| 6,331,942 | B1 | | 12/2001 | Peterson |
| 6,462,694 | B1 | | 10/2002 | Miyatake |
| 6,493,793 | B1 | | 12/2002 | Pereira et al. |
| 6,580,652 | B2 | * | 6/2003 | Roth et al. .................... 365/203 |
| 6,757,779 | B1 | * | 6/2004 | Wong et al. ................. 711/108 |
| 2003/0016575 | A1 | | 1/2003 | Regev |

OTHER PUBLICATIONS

Nick McKeown, "How Scalable is the capacity of (electronic) IP routers?", Stanford University, pp. 1–36. date unknown.

Nick McKeown, "Memory for High Performance Internet Routers", Stanford University, pp. 1–31. date unknown.

* cited by examiner

Primary Examiner—Howard L. Williams
(74) Attorney, Agent, or Firm—Dickstein Shapiro Morin & Oshinsky LLP

(57) ABSTRACT

Non-ordinal conversion is performed between signals with at most one bit asserted and respective codes, such as between priority signals from a content addressable memory (CAM) priority encoder to respective non-ordinal codes. Address encoding includes non-ordinal conversion followed by recoding to obtain ordinal address codes. Signal converting circuitry includes neighboring switching elements such as transistors that are differently offset from neighboring input lines, allowing tight pitch between input lines. To allow for offset, each transistor can have no more than one neighboring transistor. For example, neighboring input lines can have complementary sets of transistors.

51 Claims, 6 Drawing Sheets

CONVERTING DIGITAL SIGNALS

FIELD OF THE INVENTION

The invention relates to techniques that convert digital signals, such as between uncoded parallel signals and codes. The techniques can be applied, for example, to encode addresses in a content addressable memory (CAM).

BACKGROUND OF THE INVENTION

Encoding and decoding are performed in various known ways in a variety iof applications, such as in computer systems. For example, a conventional content addressable memory (CAM) can include an address encoder that provides address codes in response to priority encoder signals that indicate locations in a CAM.

FIG. 1 shows features of conventional address encoder 10, which illustratively receives location signals $L_0$ through $L_{15}$ on input lines 12 and provides four-bit address codes $A_0$ through $A_3$ on output lines 14. For proper operation, the location signals on input lines 12 are uncoded parallel signals, with at most one of location bits $L_0$ through $L_{15}$ on input lines 12 asserted at any time, while encoder 10 can assert any combination of address bits $A_0$ through $A_3$ on output lines 14, depending on which of location bits $L_0$ through $L_{15}$ is asserted. Each of input lines 12 is connected to the gate of each of a set of between zero and four transistors, and each transistor pulls down one of output lines 14 when turned on by an asserted location bit at its gate. For example, when location signal $L_{13}$ on input line 16 is asserted, transistors 20, 22, and 24 are turned on, pulling down output lines 30, 32, and 34, respectively, asserting address bits $A_0$, $A_2$, and $A_3$.

Although address encoder 10 is relatively simple, it has certain disadvantageous characteristics. For example, the series of eight transistors along output line 30 limits layout flexibility—encoder 10 must be laid out with techniques that allow a series of eight transistors connected to consecutive input lines along an output line. As the number of input lines increases, this problem becomes more pronounced, because an encoder with 32 input lines would have a series of sixteen transistors along an output line.

It would be advantageous to have more flexible techniques for signal conversion, such as between uncoded parallel signals and codes.

BRIEF SUMMARY OF THE INVENTION

The invention addresses the problem of finding more flexible techniques for signal conversion.

The invention provides improved signal conversion techniques, including techniques in which neighboring switching elements in a converter are differently offset from the lines they connect to, such as in different directions or by different magnitudes. Differently offset switching elements provide increased flexibility in laying out converter circuitry, especially where input lines have tight pitch.

The invention also provides converter circuits in which each switching element has at most one neighboring switching element. As a result, pairs of neighboring switching elements can be offset away from each other, since each switching element in the pair will not have a neighbor on the other side. This can be achieved, for example, with a converter circuit in which pairs of input lines next to each other have complementary switching elements.

The invention accordingly provides techniques in which uncoded parallel signals are converted to codes in a non-ordinal manner, i.e. a conversion that changes order between input values and output values. This occurs, for example, with complementary switching elements on neighboring input lines producing complementary output values. Complementary pairs of input lines can further be ordered to facilitate recoding from non-ordinal codes into ordinal codes.

These and other features and advantages of the invention will be apparent from the following detailed description and drawings.

DETAILED DESCRIPTION OF THE INVENTION

"Encoding" refers to conversion of a digital signal of a given size to an equivalent signal of a smaller size, referred to as a code. For example, uncoded parallel signals may be received on a number of lines, at most one of which is asserted at a time, like the location signals on input lines 12 in FIG. 1; this type of signal, sometimes referred to herein as a "one bit asserted" signal" or "signal with at most one asserted bit", can be encoded in no less than $\log_2 M$ bits. As used herein, a bit or binary signal on a line is "asserted" when it has a value indicating that a respective location has a source event or response; although a bit is sometimes referred to as "on" to indicate that it is asserted, an input signal bit in a given circuit may be asserted when it has either of its values, whether high or low, on or off, "0" or "1", and not asserted when it has the other value. In a content addressable memory (CAM), for example, the uncoded parallel signals could be an output of a priority encoder with at most one asserted bit, and the respective code could be an address code. "Decoding" refers to an inverse operation. For example, a code of $\log_2 M$ bits can be decoded to an equivalent uncoded parallel signal on M lines, at most one of which is asserted. The more general term "conversion" includes encoding, decoding, and any other operation that converts signals from one form to another.

Figure 2:
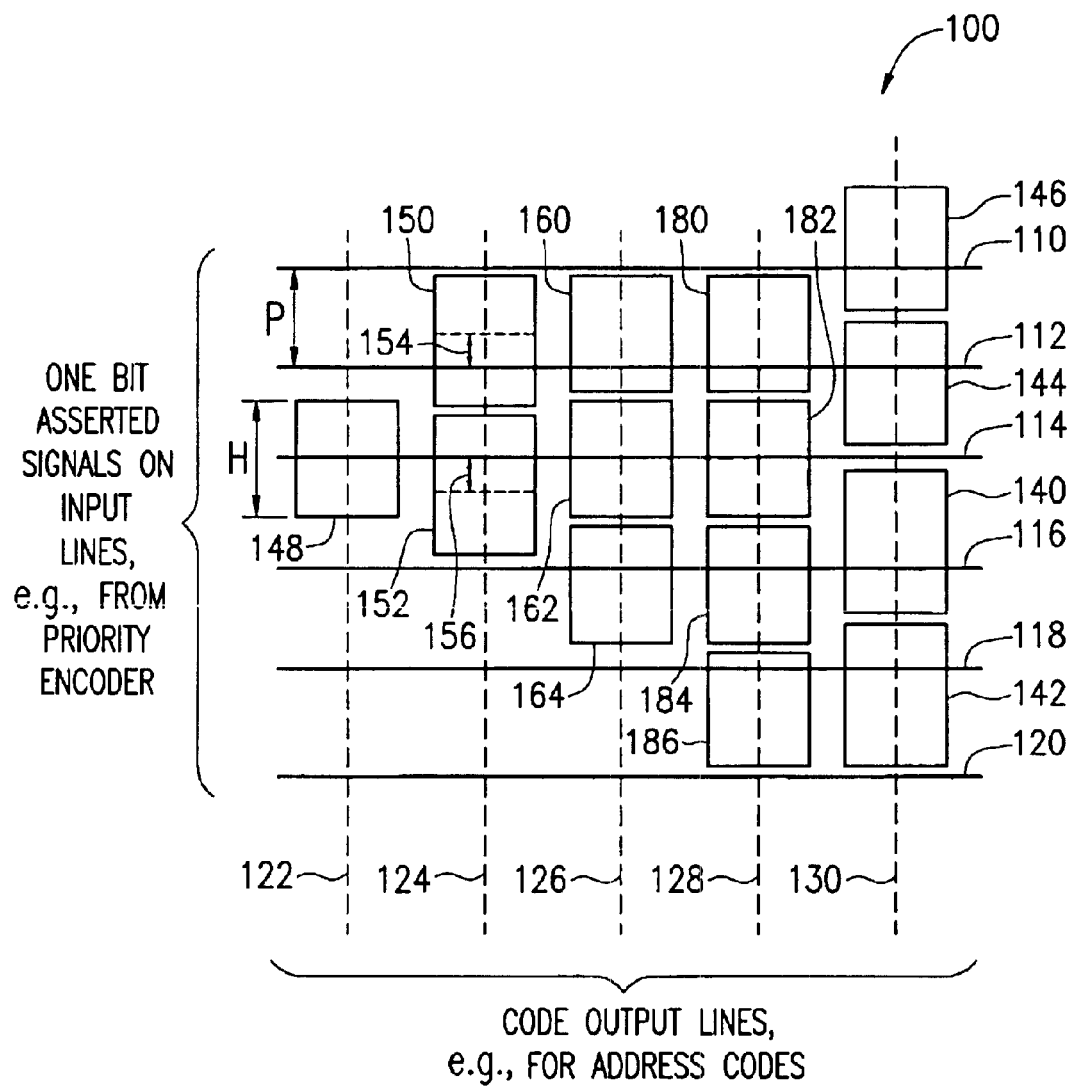
FIG. 2 is a schematic plan view showing several layouts of differently offset neighboring switching elements in converting circuitry.

FIG. 2 shows signal converting circuitry 100 with several exemplary layouts of switching elements. Parallel input lines 110, 112, 114, 116, 118, and 120 are illustratively extensions of lines from other circuitry on which signals with at most one asserted bit are provided, such as priority lines from a CAM's priority encoder (not shown). To satisfy applicable constraints, input lines 110 through 120 are regularly positioned at a uniform spacing or pitch P; constraints could include, for example, space available for the priority encoder or for converting circuitry 100 on a substrate, process considerations that dictate uniform spacing, or others. Although each input line has width, the input lines are schematically represented by their center lines, with P measured between center lines of neighboring input lines as shown.

Code output lines 122, 124, 126, 128, and 130 cross input lines 110 through 120, extending in another direction perpendicular to that in which input lines 110 through 120 extend. In the illustrated portion of converting circuitry 100, each input line has a set of between zero and four switching elements connected to it, and each switching element is also connected to one of the output lines. As discussed in greater detail below, switching elements connected to an output line together affect the signal provided on the output line in response to their input signals. In response to an asserted signal on an input line, each switching element connected to the input line can change or control a signal on its connected output line, such as by pulling the output line up or down or by providing a signal on it in some other way.

Lines that are next to each other are sometimes referred to herein as "neighboring lines"; a series of neighboring lines may also be referred to as "consecutive lines". If the spaces between parallel lines are equal, they are referred to as "regularly spaced".

Switching elements connected to the same line in one direction and to neighboring lines in the other direction are referred to herein as "neighboring switching elements". For example, switching elements 140 and 142 are neighbors because they are both connected to output line 130 and they are connected to neighboring input lines 116 and 118, respectively. Switching elements 144 and 140, on the other hand, are not neighbors along output line 130 because they are connected to input lines 112 and 116, which are not next to each other. Switching elements 144 and 146 are again neighbors. Similarly, switching element 148 does not have any neighboring switching elements along output line 122, because there is no switching element connected to either of input lines 112 or 116 along output line 122.

Each switching element can be characterized as having an "offset", meaning the difference between the center of the area it occupies and a line to which it is connected. A switching element's offset could be measured in various ways, but for an appropriately aligned rectangular or other regularly shaped switching element, its offset can be measured as a distance or magnitude and a direction from a connecting line to the switching element's center line.

FIG. 2 illustrates several examples in which neighboring switching elements are "differently-offset" from the lines to which they connect, meaning that the offsets of the switching elements relative to their connecting lines are different. If measured as a magnitude and a direction, as mentioned above, offsets could be different in direction or magnitude or both.

Pitch P is a tight pitch in the sense that it not larger than the effective height H of switching element 146, which is approximately the same as the effective height of the other illustrated switching elements. Height H may be determined by various design constraints such as process limitations, necessary area or aspect ratio for each switching element, spacings between output lines, and so forth. Although this is not problematic for switching element 146, which does not have any neighbors along output line 122, these constraints may make it difficult to accommodate a long series of neighboring switching elements along an output line. For example, in address encoder 10 in FIG. 1, the series of eight neighboring switching elements along output line 30 would have a combined effective height of 8H; if each switching element were centered on its input line, it would be difficult to accommodate all the switching elements within a tight pitch.

Switching elements along output lines 124, 126, 128, and 130 in FIG. 2 illustrate features of a solution that alleviates the tight pitch problem. The problem can be alleviated by laying out two or more of a series of neighboring switching elements with different offsets from lines to which they are connected.

Switching elements 150 and 152 along output line 124 illustrate an example of neighboring switching elements with different offsets. Switching elements 150 and 152 have centerlines offset from input lines 112 and 114, respectively, by upward offset 154 and downward offset 156. Offsets 154 and 156 are therefore different in direction, differing by 180 degrees, though they may be approximately equal in magnitude. The offsets are possible because switching elements 150 and 152 are each other's only neighbors; the combined effective heights of switching elements 150 and 152 illustratively approximates three times the pitch, or 3P, by occupying the pitches between input lines 110, 112, 114, and 116. Each of switching elements 150 and 152 therefore has an effective height approximating 3P/2, and the effective height of switching element 152 could be made even greater, extending across lines 118 and 120 because there are no switching elements connected to those lines along line 122.

Switching elements 140 and 142 similarly have centerlines offset from input lines 116 and 118, respectively, by an upward offset and a downward offset, as do switching elements 146 and 144 from input lines 110 and 112, respectively. In this example, however, the effective heights are limited because switching elements 140 and 144, even though not neighbors, must share the pitches between input lines 112, 114, and 116.

Switching elements 160, 162, and 164 along line 126 illustrate a differently offset solution for a series of three switching elements. In the illustrated example, switching element 162 has a centerline that is not offset from input line 114, but switching elements 160 and 164 have centerlines that are offset from input lines 112 and 116, respectively, by an upward offset and a downward offset.

Switching elements 180, 182, 184, and 186 along line 128 illustrate a differently offset solution for a series of four switching elements. In this example, switching elements 180 and 182 have centerlines offset from input lines 112 and 114, respectively, by upward offsets of different magnitude, while switching elements 184 and 186 have centerlines offset from input lines 116 and 118, respectively, by downward offsets of different magnitude.

Although FIG. 2 illustrates differently offset regularly shaped switching elements connected to uniformly spaced input and output lines extending in perpendicular directions, different offsets could be applied to switching elements of any shape connected to lines that are neither uniformly spaced nor perpendicular. In FIG. 2, switching elements have centerlines differently offset from input lines, but could instead be differently offset from output lines or from both input and output lines. The switching elements in FIG. 2 could be implemented with transistors or with other appropriate devices that change state in response to input signals and provide signals on output lines.

Figure 1:
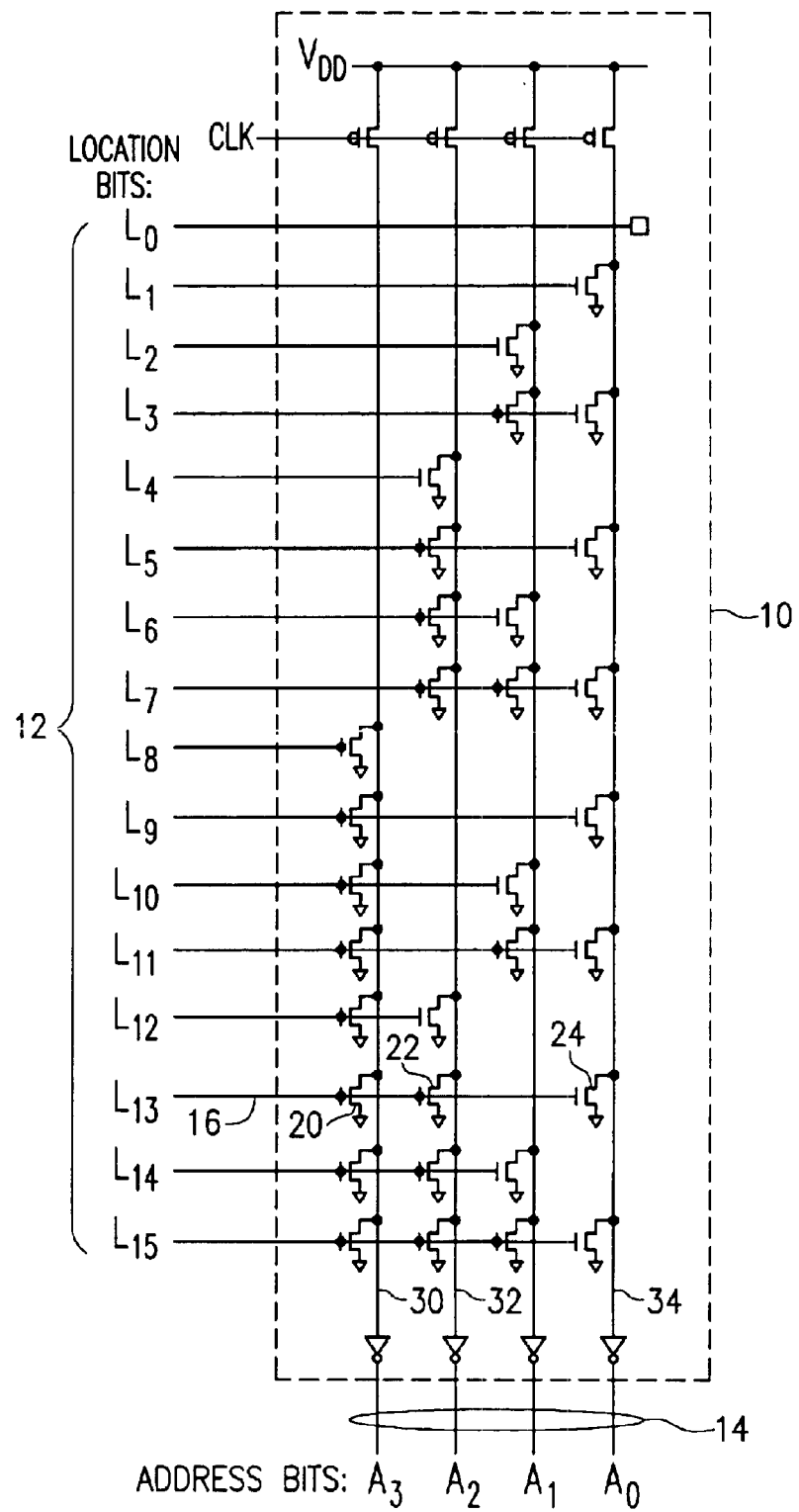
FIG. 1 is a schematic circuit diagram of a conventional address encoder.
Figure 3:
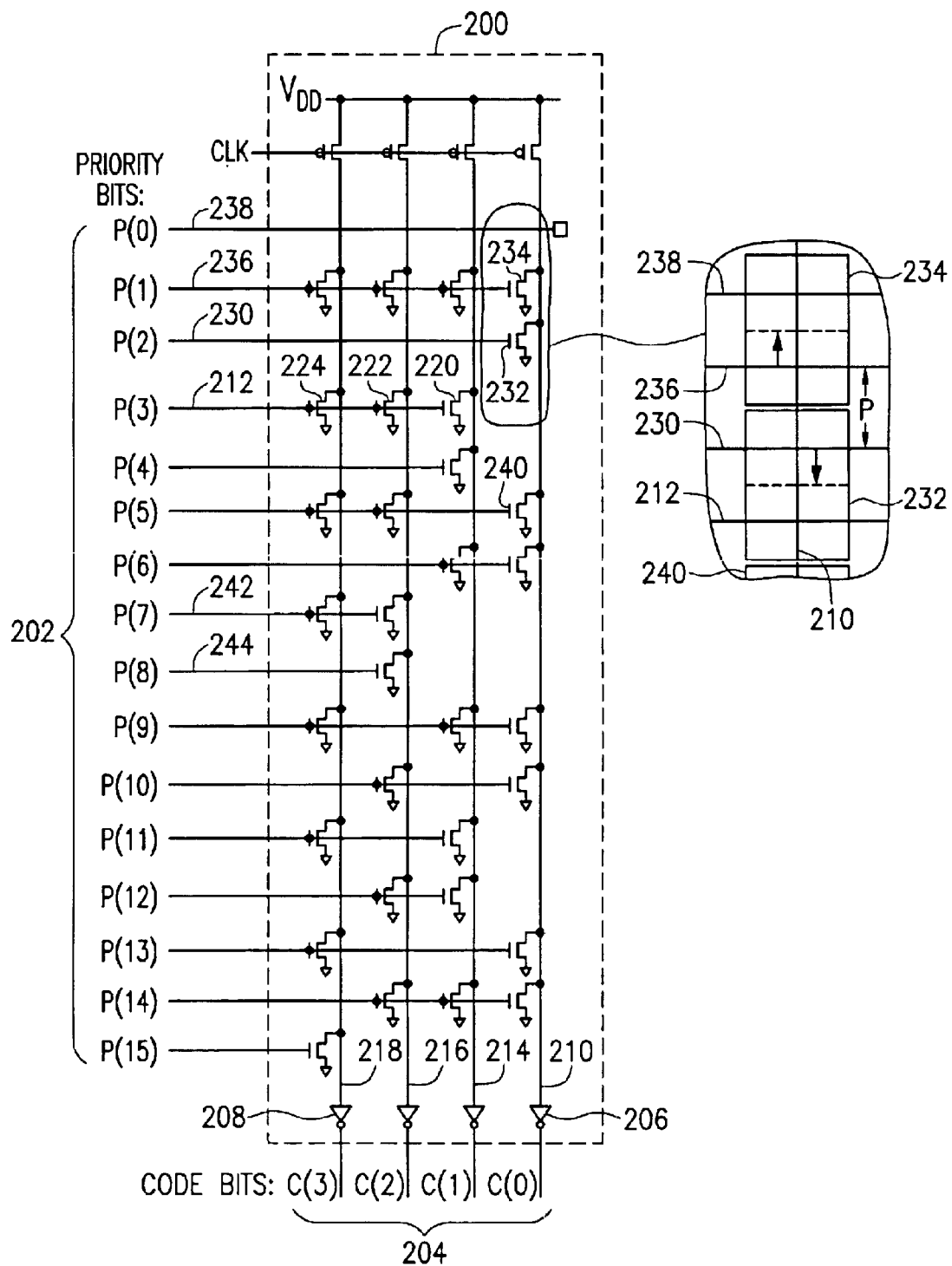
FIG. 3 is a schematic circuit diagram of a non-ordinal converter circuit that includes differently offset neighboring transistors.

FIG. 3 illustrates converter circuit 200, similar in some respects to address encoder 10 in FIG. 1. Unlike address encoder 10, however, no switching element in circuit 200 has more than one neighboring switching element, so that no series of switching elements includes more than two switching elements. As a result, each series of neighboring switching elements can be laid out to include switching elements with centerlines differently offset from input lines, as illustrated in FIG. 2. Furthermore, as discussed below, the arrangement in FIG. 3 allows the effective height of each switching element to approach 2P, where P is the pitch between input lines.

In an exemplary embodiment, circuit 200 can be used in a content addressable memory (CAM) to convert priority signals received on M lines from a priority encoder into respective codes, each with $\log_2 M$ bits. The codes from circuit 200 could be used directly as address codes, such as to access information relevant to a matching CAM entry indicated by the priority signals, or, as explained below, the codes could be recoded to obtain address codes. As shown, circuit 200 has M input lines 202 that receive priority bits P(0) through P(15) and N output lines 204 that provide code bits C(0) through C(3), where M is equal to $2^N$. In circuit 200, M is sixteen and N is four, but these values are merely illustrative.

For each of input lines 202, circuit 200 includes a set of between zero and four switching elements, specifically NMOS transistors with gates connected to the input line. When turned on by an asserted priority bit on its input line, each transistor in the set changes a respective code bit on one of the output lines by providing a conductive path to ground so that the respective code bit, after inversion by one of inverters 206 through 208, goes from low to high. In the following, an output low is treated as "0" and a high as "1", but these could be reversed.

During operation of circuit 200, a clock signal (clk) is initially low, and each output line's PMOS transistor is on, charging the line to $V_{DD}$, while all the input lines are held low. Then, when clk goes high, the PMOS transistors are turned off and precharging stops. If an input line then receives an asserted priority bit, its connected NMOS transistors turn on, causing the output lines to provide a respective binary code for the input line. The NMOS transistors connected to each output line are configured to form a clocked dynamic OR gate, meaning that, for proper conversion, only one priority bit can be asserted at a time.

The respective binary codes for the input lines 202 are all unique, in the sense that no two input lines have the same code. In addition, the codes are all between zero and fifteen, with the least significant code bit appearing on output line 210. For example, when an asserted priority bit is received on input line 212, the least significant code bit on output line 210 remains at "0", while the most significant code bits on lines 214, 216, and 218 all go to "1" because transistors 220, 222, and 224 are turned on, respectively. As a result, a priority signal on input lines 202 with P(3) asserted is converted to a binary code "1110" on output lines 204.

One feature of circuit 200 is that complementary sets of transistors are on input lines next to each other, producing complementary codes on output lines 204. For example, line 212 has transistors on output lines 214, 216, and 218, producing "1110" when P(3) is asserted, while the next input line 230 has a transistor on line 210, producing "0001" when P(2) is asserted. This can be stated generally as follows: For k=0 to (M/2−1), the respective binary address codes provided by the output signals for the (2k)th and (2k+1)th input lines are complementary. In this case, M=16 and (M/2−1)=7.

FIG. 3 therefore illustrates a converter circuit with M input lines that receive uncoded parallel signals with at most one asserted bit, such as priority signals from a priority encoder, and N output lines that provide binary codes such as address codes, where M is equal to $2^N$. For each input line, the circuit includes a set of between zero and N transistors with gates connected to the input line. Each transistor in a set is connected to change a respective code bit on one of the output lines when turned on by an asserted signal on the input line. While an input line receives an asserted signal, the output lines together provide a respective code for the input line. In the illustrated exemplary embodiment, the respective codes for the input lines are all unique and between zero and (M−1). For k=0 to (M/2−1), the respective codes provided by the output signals for the (2k)th and (2k+1)th input lines are complementary.

Where an input line is next to another line with a complementary set of transistors, none of the input line's transistors will have a neighboring transistor on the other line. Therefore, the arrangement in circuit 200 ensures that each transistor will have at most one neighboring transistor. By inspecting FIG. 3, it can be seen that the longest series of neighboring transistors are all two transistors long. To alleviate the tight pitch problem, the transistors in each series are differently offset from their input lines as illustrated in the detail showing transistors 232 and 234 with offsets in opposite directions from input lines 230 and 236, respectively. The offset of transistor 234 could be treated as a positive offset in the direction of line 210, while the offset of transistor 232 could be treated as a negative offset.

The detail also shows how each transistor in the arrangement of circuit 200 can have an effective height that approximates 2P. Since there are 16 regularly spaced input lines in circuit 200, the total of the pitches between lines is 15P, and if an additional P/2 is available beyond the upper and lower input lines, the total available height for transistors is 16P. Since there are eight transistors along each output line, the maximum available average effective transistor height is 16P/8=2P. It is easy to approximate an effective height of 2P for each transistor along line 218, where the transistors are connected to alternate input lines. But an effective height of approximately 2P can also be achieved along lines 210, 214, and 216. As shown in the detail, where two transistors are connected to neighboring input lines, each transistor can extend across an adjacent input line on one side, because there is not a neighboring transistor on that side. Transistor 234 illustratively extends across input line 238 by nearly P/2, while transistor 232 similarly extends across input line 212 by nearly P/2, where it borders transistor 240.

This can also be understood by starting at the central pair of switching elements along each output line and working outward, assigning one transistor to each pair of input lines. Because of the arrangement of transistors in circuit 200, the input lines can be paired such that only one of each pair needs to connect to a given transistor that extends across the pair, and the transistor can extend P/2 above and below the pair of input lines, for an effective height of approximately P/2+P+P/2=2P. For example, each of the central pair of switching elements along each output line can extend approximately 2P across the first pair of input lines from the center, i.e. from the midpoint between lines 242 and 244. Then each of the next pair of switching elements can extend approximately 2P across the next pair of input lines, and so forth. If the transistors are laid out in this way, they can also be laid out in a uniform grid; in that case, the only additional necessary design decision is to determine whether each transistor connects to the upper or lower input line in the pair that it crosses, which follows directly from the arrangement in FIG. 3.

Another feature of circuit 200 relates to the order in which values are converted. For each binary signal with at most one asserted bit on lines 202, the value of the binary signal can be the number of the asserted bit, or zero if no bit is asserted. The mapping from binary signals on lines 202 to 4-bit codes on lines 204 is as follows:

0000 to 0000;
0001 to 1111;
0010 to 0001;
0011 to 1110;
0100 to 0010;
0101 to 1101;
0110 to 0011;
0111 to 1100;
1000 to 0100;
1001 to 1011;
1010 to 0101;
1011 to 1010;
1100 to 0110;
1101 to 1001;
1110 to 0111; and
1111 to 1000.

The above conversion is referred to herein as "non-ordinal" because the binary values on output lines 204 are not in the same order as those on input lines 202. In contrast, the conversion by address encoder 10 in FIG. 1 is an ordinal encoding in which input signal 0000 is encoded as 0000, 0001 as 0001, 0010 as 0010, etc. to 1111 encoded as 1111. As used herein, ordinal encodings include those in which the order of output codes is the same as the order of input signals with at most one asserted bit, as in FIG. 1, or is reversed, such as by obtaining the complement of each output code.

Non-ordinal conversion allows greater flexibility in arranging circuitry within an address encoder. For example, where pitch is tight, a non-ordinal converter can be used in which no transistor has neighbors on both sides along a code line such as an output code line, meaning that every transistor is next to an area in which there is no transistor along the line. Therefore, a transistor that otherwise would not fit into the available pitch can be shifted to partially overlap its neighboring area, such as with an offset as described above in relation to FIG. 2.

Although FIG. 3 illustrates an encoding in which only one of each pair of input lines is connected to a given transistor that extends across them, other encodings could provide other possibilities. For example, some of the arrangements illustrated in FIG. 2 could be modified to obtain encodings in which at most two of each group of three input lines are connected to transistors, or at most three of each group of four input lines, or at most three of each group of five input lines, and so forth. These additional possibilities might be of interest if there were fewer than $2^N$ input lines, where N is the number of output lines; if there are $2^N$ input lines, only one of each pair of input lines needs to be connected to a given transistor.

Figure 4:
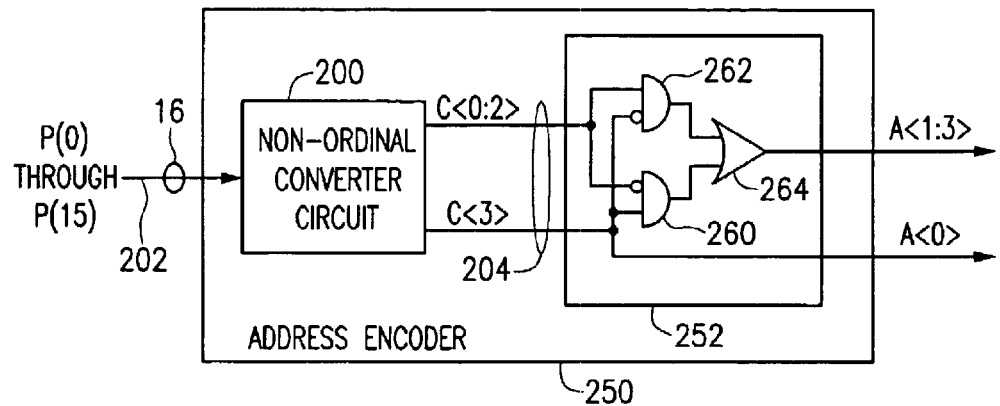
FIG. 4 is a schematic block diagram showing components of an address encoder that includes a non-ordinal converter circuit as in FIG. 3.

The difference in the codes obtained with non-ordinal conversion may be inconsequential in applications in which the respective codes need not be equal to or in the same order as input signals. But in some applications it is desirable to obtain an ordinal encoding. FIG. 4 illustrates address encoder 250, which performs the same ordinal encoding as encoder 10 in FIG. 1 but using circuit 200 of FIG. 3.

As used herein, "address signal", "address code", and similar terms refer broadly to any signal, code, etc. that indicates a location at which an item of data may be stored, retrieved, received, or transmitted, such as a location in a register or other memory circuitry or an input or output port or other circuit or network connection, rather than indicating content of the item of data at that location. Although address signals can be used to access locations for storage, retrieval, reception, or transmission, an address signal can more generally be any signal indicating one or more of a set of locations without actually being used for access. In a content addressable memory (CAM), for example, a priority signal from a priority encoder is an address signal because it indicates one or more locations in the CAM; the priority signal may be encoded to obtain an address code that may be used, for example, to access information relating to the CAM location.

In addition to circuit 200, address encoder 250 includes recoder 252, which receives 4-bit codes C<1:4> as in the right side of the above mapping from output lines 204 and recodes them to obtain 4-bit address codes A<1:4> as in the left side of the above mapping. As shown, recoder 252 provides the most significant bit C<3> from its input as the least significant bit A<0> at its output. In addition C<3> controls AND gates 260 and 262, determining whether A<1:3> are identical to C<0:2> or are instead the inverse, ~C<0:2>. If C<3> is "1", then AND gate 260 passes ~C<0:2> to OR gate 264 while AND gate 262 provides "000" to OR gate 264, so that A<1:3> is ~C<0:2>. If C<3> is "0", AND gate 262 passes C<0:2> to OR gate 264 while AND gate 260 provides "000" to OR gate 264, so that A<1:3> is C<0:2>.

Although recoder 252 would not be necessary if an ordinal address encoding were performed, the combination of non-ordinal converter circuit 200 and recoder 252 can in certain cases occupy a smaller area than conventional address encoder 10 in FIG. 1. This is true where the pitch is sufficiently tight to reduce the area of converter circuitry 200 by more than the area of recoder 252.

More generally, the pitch required can be determined by other circuitry, in which case the encoder must fit within the available pitch. In some cases, there are multiple input lines per pitch; for example, a CAM array might have four lines per cell pitch, and an encoder would therefore need to have a pitch that is one-fourth that of each CAM cell. In some designs, the spacing between output lines can be widened so that pull-down transistors from adjacent lines are placed side by side; because of layout design rules, however, this can take more layout area than if pitch was greater even though the number and size of transistors is the same in both cases. In general, a tighter pitch tends to require more layout area for a given circuit because it is more difficult to avoid wasting area.

Figure 5:
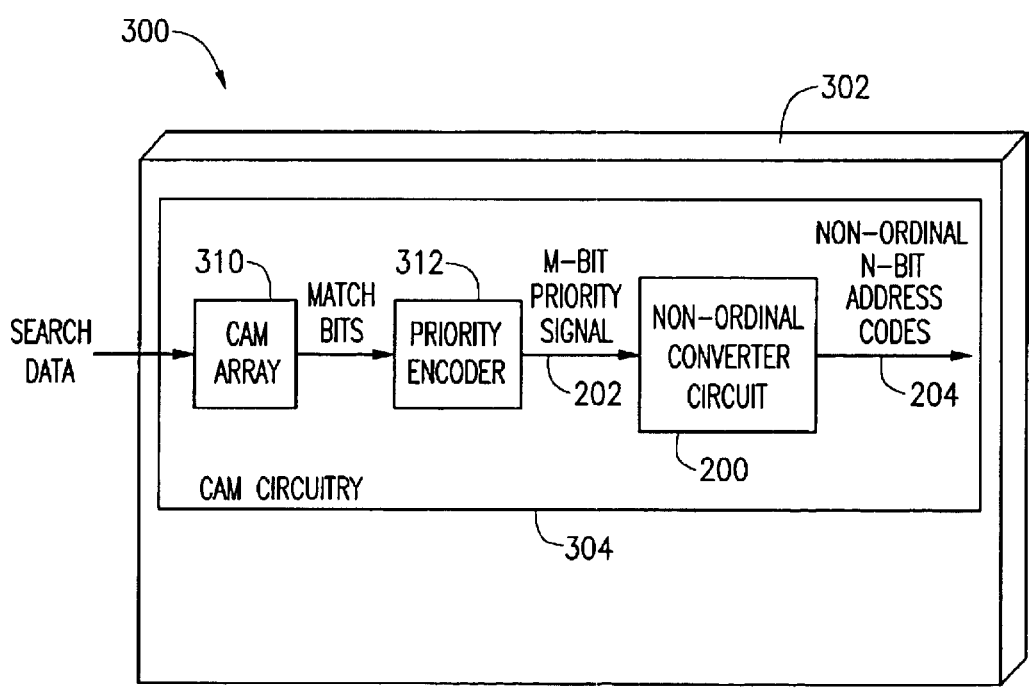
FIG. 5 is a schematic plan view of an integrated circuit that includes CAM circuitry with a non-ordinal converter circuit as in FIG. 3.

FIG. 5 shows integrated circuit (IC) 300 with substrate 302 and CAM circuitry 304 (and optionally other circuitry not shown) formed at a surface of substrate 302. IC 300 may therefore be referred to as a "CAM chip". CAM circuitry 304 includes CAM array 310, priority encoder 312, and non-ordinal converter circuit 200 as in FIG. 3.

CAM array 310 stores a set of data entries in locations, receives a search data item, and provides match bits, each indicating whether any of a respective set of locations has a data entry that satisfies a matching criterion relative to the search data. The match bits are examples of "match signals", referring herein to a signal indicating search results, however obtained, whether by comparing one memory location's data entry with a search index, by logically combining a number of such comparison results to obtain a combined match signal, or by any other appropriate comparison technique.

Priority encoder 312, in response to match bits from CAM array 310, provides a priority signal on M lines 202, with at most one bit asserted. A bit in a priority signal is "asserted" when it has a value indicating that a match signal or other input signal is asserted and has priority; in this context, a priority signal bit may be asserted when it has either of its values, whether high or low, on or off, "0" or "1". An asserted bit from priority encoder 312 indicates a set of one or more locations in CAM array 310 for which a match bit indicates that a stored data entry satisfies the matching criterion. Priority encoder 312 can have tight pitch as illustrated in FIG. 2.

As described above in relation to FIG. 3, converter circuit 200, in response to a priority signal on lines 202, provides a respective N-bit address code on lines 204, where N is less than M and at least as great as $\log_2 M$. Specifically, M can be sixteen and N can be four. The respective N-bit address codes together are a non-ordinal encoding of the priority signals.

Figure 6:
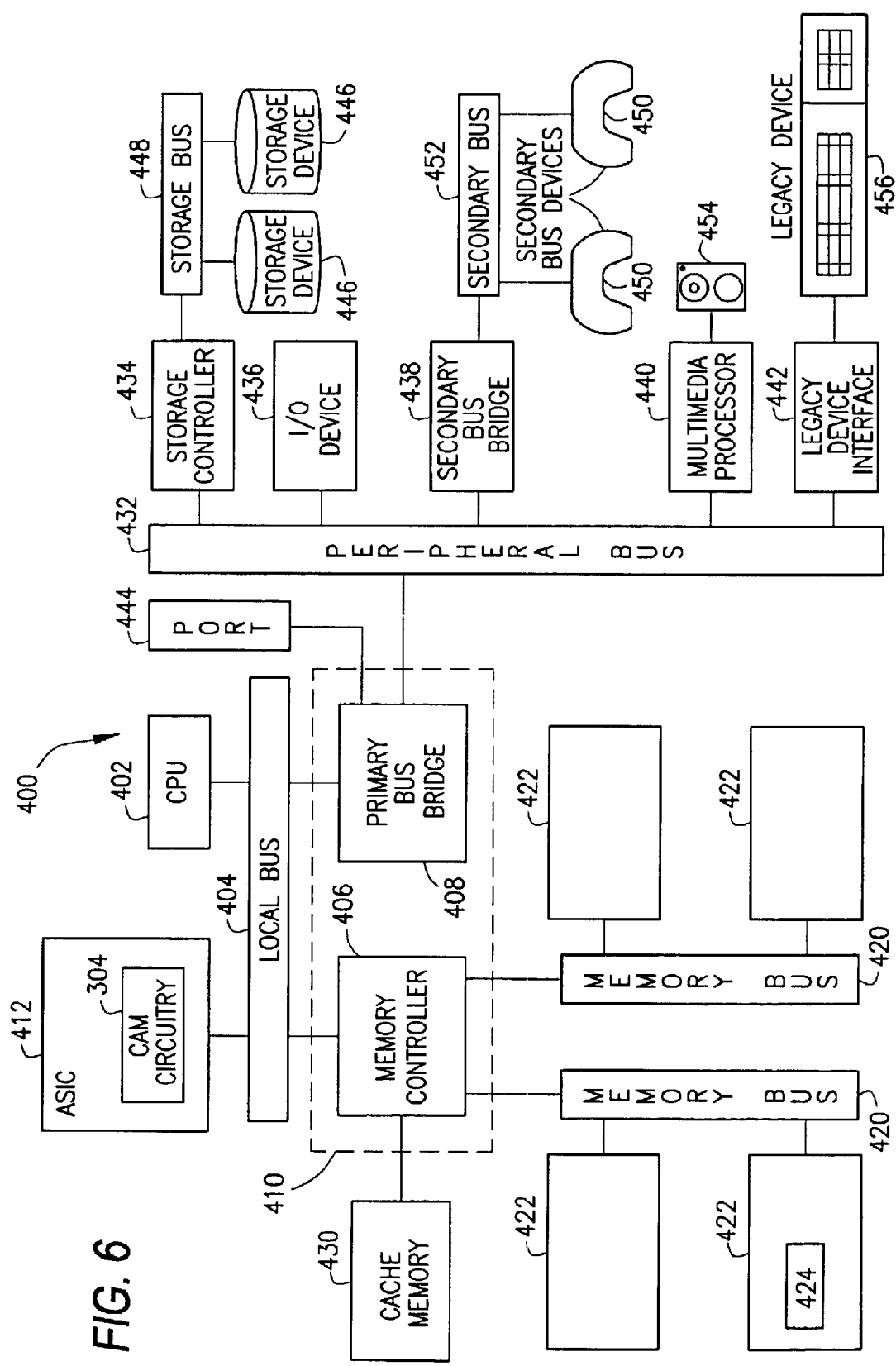
FIG. 6 is a schematic block diagram of a system that includes an integrated circuit with CAM circuitry as in FIG. 5.

FIG. 6 illustrates an exemplary processing system 400 that includes CAM circuitry 304 as shown in FIG. 5 on an application specific integrated circuit (ASIC). Processing system 400 includes one or more processors (CPUs) 402 connected to local bus 404. Memory controller 406 and primary bus bridge 408 are also connected to local bus 404. Processing system 400 may include multiple memory controllers 406 and/or multiple primary bus bridges 408. Memory controller 406 and primary bus bridge 408 may be integrated as a single device 410. ASIC 412 is also illustratively connected to local bus 404, and includes CAM circuitry 304 as in FIG. 5, embedded with other circuitry suitable to the application. ASIC 412 could, for example, be an additional CPU.

Memory controller 406 is also connected to one or more memory buses 420. Each memory bus accepts memory components 422, each of which may be a memory card or a memory module, for example. Some memory components 422 may include one or more additional devices 424. For example, in a SIMM or DIMM, additional device 424 might be a configuration memory, such as a serial presence detect (SPD) memory.

Memory controller 406 may also be connected to cache memory 430, which may be the only cache memory in processing system 400. Alternatively, other devices, such as processors 402, may also include cache memories, which may form a cache hierarchy with cache memory 430. If processing system 400 includes peripherals or controllers that are bus masters or that support direct memory access (DMA), memory controller 406 may implement a cache coherency protocol. If memory controller 406 is connected to two or more memory buses 420, each of memory buses 420 may be operated in parallel, or different address ranges may be mapped to different memory buses 420.

Primary bus bridge 408 is connected to at least one peripheral bus 432. Various devices, such as peripherals or additional bus bridges, may be connected to peripheral bus 432. These devices may include storage controller 434, miscellaneous I/O device 436, secondary bus bridge 438, multimedia processor 440, and legacy device interface 442. Primary bus bridge 408 may also be connected to one or more special purpose high speed port 444. In a personal computer, for example, special purpose high speed port 444 might be an Accelerated Graphics Port (AGP), used to connect a high performance video card to processing system 400.

Storage controller 434 connects one or more storage devices 446, accessed via storage bus 448, to peripheral bus 432. For example, storage controller 434 may be a SCSI controller and storage devices 446 may be SCSI discs. I/O device 436 may be a local area network interface, such as an Ethernet card. Secondary bus bridge 438 may provide an interface between processing system 400 and secondary bus devices 450 via secondary bus 452. For example, secondary bus bridge 438 may be a universal serial port (USB) controller and secondary bus devices 450 may be USB devices. Multimedia processor 440 may be a sound card, a video capture card, or any other type of media interface, and may also be connected to an additional device such as speakers 454. Legacy device interface 442 connects one or more legacy devices 456, such as older style keyboards and mice, to processing system 400.

Processing system 400 in FIG. 6 is only exemplary of processing systems in which the invention can be used. While FIG. 6 illustrates a processing architecture especially suitable for a general purpose computer, such as a personal computer or workstation, well known modifications can be made to configure processing system 400 to be more suitable for use in various specific applications. For example, many electronic devices that require processing may be implemented using a simpler architecture that relies on a CPU 402 connected to memory components 422 and/or memory devices 424. Modifications may include, for example, elimination of unnecessary components, addition of specialized devices or circuits, and/or integration of two or more devices.

Figure 7:
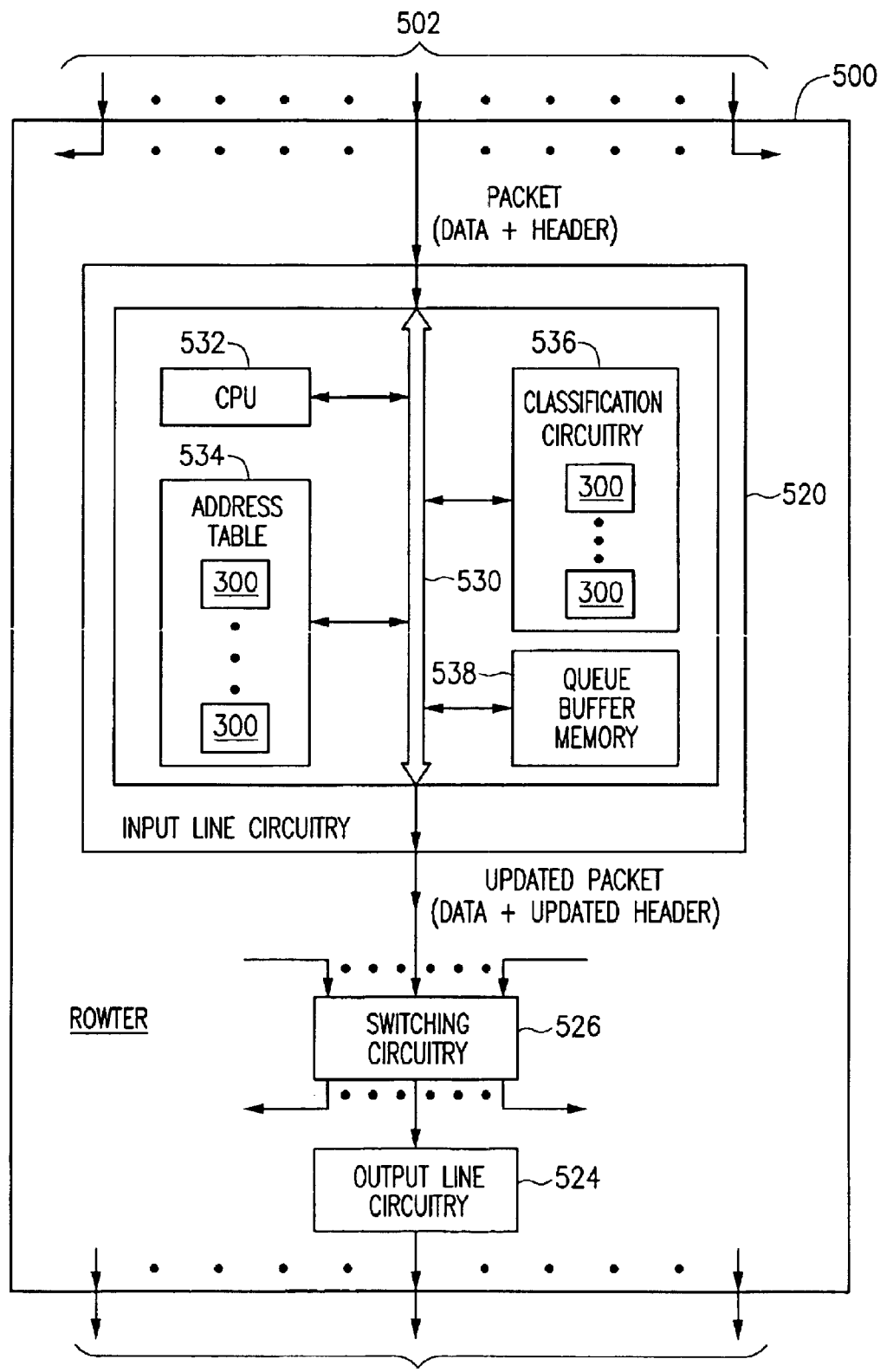
FIG. 7 is a schematic circuit diagram of a router that includes integrated circuits as in FIG. 5.

A more common application of CAM circuitry is in routers. FIG. 7 shows a simplified block diagram of a router 500 as may be used in a communications network such as the Internet backbone. Router 500 has input lines 502 and output lines 504. In applications where data is transmitted from location to location in packets, router 500 can receive a packet on input lines 502, decode a part of the packet identifying its final destination, provide forwarding instructions for the packet, and transmit the packet on output lines 504.

Router 500 includes circuitry for each input line, as illustrated by input line circuitry 520 for one of input lines 502. Router 500 similarly includes circuitry for each output line, as illustrated by output line circuitry 524 for one of output lines 504. Input line circuitry 520 and output line circuitry 524 can each be implemented as linecards, and a respective linecard can sit on each ingress or egress port. Ingress port linecards can receive input packets from input lines 502, process them, and send the resulting processed packets via switching circuitry 526 to egress port linecards. Egress port linecards can further process the packets before sending them out on output lines 504. Therefore, ingress and egress port linecards can be implemented with similar or identical circuitry, so that the same linecard could be used either as input line circuitry 520 or output line circuitry 524.

Exemplary components of input line circuitry 520 are shown, although circuitry 520 could be implemented in many different ways. Bus circuitry 530 provides communication between CPU 532 and other components, which include address table 534, classification circuitry 536, and queue buffer memory 538. Address table 534 and classification circuitry 536 each illustratively include a set of one or more CAM chips 300, as in FIG. 5. CAM chips 300 can be used to efficiently retrieve information used by CPU 532 in processing and retransmitting packets.

In operation, CPU 532 can provide a packet's internet protocol (IP) address to address table 534, where the IP address can be provided to CAM chips 300 as a search key for retrieval of an IP address for the next hop. Then CPU 532 uses the next hop's IP address to update the packet's header. CPU 532 can also provide all or part of the packet to classification circuitry 536, which can respond with information for services such as prioritization, security, accounting, traffic shaping, and so forth. Classification circuitry 536 can provide parts of the packet to CAM chips 300 as search keys for retrieval of relevant information. Upon updating the packet's header (and possibly also its data) to include the next hop IP address and possibly information from classification circuitry 536, CPU 532 can provide the packet to queue buffer memory 538, where it is stored until it can be retransmitted, such as through switching circuitry 526.

Although the invention has been described with specific reference to address encoding for CAM applications, the invention has broader applicability and may be used, for example, in various applications in which signals are converted, especially conversion between uncoded parallel signals, such as signals with at most one asserted bit, and respective codes. In general, the described conversion techniques are applicable to M-bit uncoded parallel signals where M has any appropriate value, not only applications where M is sixteen or another power of two. Also, although exemplary circuits and IC layout features have been described and illustrated, various other circuits and layouts could be employed. For example, the illustrated circuits include only input and output lines, but the illustrated techniques would be equally applicable to circuits with additional lines, such as ground lines, extending in one or both directions. Similarly, the methods described above are merely exemplary.

The above description and drawings illustrate exemplary embodiments that achieve the objects, features, and advantages of the invention, but it is not intended that the invention be limited to any illustrated or described embodiment. Any modification that comes within the spirit and scope of the following claims should be considered part of the invention.

What is claimed as new and desired to be protected by Letters Patent of the United States is:

1. A coding circuit comprising:
   M input lines that receive input signals each including at most one asserted bit, and N output lines that provide binary codes, where M is equal to $2^N$; and
   for each of the input lines, a set of between zero and N transistors with gates connected to the input line, each of the transistors in the set being connected to change a respective code bit on one of the output lines when turned on by an asserted bit on the input line; while an input line receives an asserted bit, the output lines together providing a respective binary code for the input line; the respective binary codes for the input lines all being unique and between zero and (M−1);
   for k=0 to ((M/2)−1), the respective binary codes provided by the output signals for the (2k)th and (2k+1)th input lines being complementary.

2. The circuit of claim 1 in which, for each output line, the transistors that change code bits on the output line are connected in a dynamic OR configuration.

3. The circuit of claim 1 in which the transistors that change code bits on the output lines are NMOS transistors.

4. The circuit of claim 1 in which the input signals indicate locations; the respective binary code of each input line being an address code.

5. The circuit of claim 1 in which M is 16 and N is 4.

6. A signal converter circuit comprising:
   first and second sets of lines extending respectively in first and second directions, the first and second directions being different; one of the first and second sets being input lines that receive input signals and the other being output lines that provide output signals; and
   switching elements, each switching element controlling one of the output lines in response to one of the input lines; the output signals being converted versions of the input signals; a series of P of the switching elements being connected to one of the second lines and to P consecutive lines in the first set, P being two or more; at least two switching elements in the series having different offsets in the second direction relative to their connected lines in the first set.

7. The circuit of claim 6 in which the lines in the first set are parallel and neighboring lines in the first set are regularly spaced from each other in the second direction by a pitch, the combined effective height of the series of P switching elements being greater than P times the pitch.

8. The circuit of claim 7 in which the combined effective height of the series of P switching elements is approximately 2P times the pitch.

9. The circuit of claim 6 in which P is one of two, three, or four.

10. The circuit of claim 6 in which the offsets are different in direction.

11. The circuit of claim 6 in which the offsets are different in magnitude.

12. The circuit of claim 6 in which the lines in the first set are input lines and the lines in the second set are output lines.

13. The circuit of claim 6 in which each switching element includes a transistor.

14. A signal converter circuit comprising:
   input lines that receive input signals;
   output lines that provide output signals; and
   switching elements, each switching element controlling one of the output lines in response to an asserted input signal on one of the input lines; the switching elements that respond to an asserted input signal on one of the input lines together providing a respective output signal on the output lines that is converted from the asserted input signal; each switching element having at most one neighboring switching element controlling the same output line.

15. The circuit of claim 14 in which one of the switching elements has a neighboring switching element controlling the same output line, the switching element and the neighboring switching element having different offsets in the second direction relative to the input lines to which they respond.

16. The circuit of claim 14 in which each input signal has at most one asserted bit.

17. The circuit of claim 14 in which the respective output signal of each asserted input signal on one of the input lines is complementary with the respective output signal of an asserted input signal on one of the input line's neighboring input lines.

18. A signal converter circuit comprising:
   input lines that receive input signals;
   output lines that provide, for each of the input signals, a respective code; and
   converting circuitry that responds to the input signals, providing the respective codes on the output lines; the converting circuitry responding to assertion of each input line by asserting a respective set of code bits on the output lines; the respective codes bits of each input line being complementary with the respective set of code bits of one of the input line's neighboring input lines.

19. The circuit of claim 18 in which there are M input lines and N output lines, where N is less than M and at least as great as $\log_2 M$.

20. The circuit of claim 18 in which there are M input lines and N output lines, where $N = \log_2 M$.

21. The circuit of claim 18 in which there are M input lines and the respective code of each of the input signals is unique and between zero and (M−1).

22. An encoder circuit comprising:
signal converter circuitry that receives input signals and, in response to each input, signal, provides a respective code; the signal converter circuitry providing respective codes that together are a non-ordinal conversion of the input signals; and
recoding circuitry that, in response to each input signal's respective code, provides a recoded code, the recoded codes being an ordinal encoding of the input signals.

23. The circuit of claim 22 in which the input signals are each M-bit signals with one bit asserted and the recoded codes include at least $\log_2 M$ bits, each input signal's respective code being unique and between zero and (M−1).

24. An address converter circuit comprising:
M input lines extending in a first direction, the input lines receiving input signals indicating locations;
N output lines extending in a second direction perpendicular to the first direction, the output lines providing N-bit address codes; N being less than M and at least as great as $\log_2 M$; neighboring input lines being spaced from each other in the second direction by a pitch; and
switching elements, each switching element connected to one of the input lines and one of the output lines; each switching element responding to assertion of its input line by changing the address code bit on its output line;
the switching elements connected to one of the output lines including a pair of neighboring switching elements connected to neighboring input lines; the combined effective height of the pair of neighboring switching elements being greater than twice the pitch; one of the neighboring switching elements having a positive center line offset in the second direction from its connected input line, the other of the neighboring switching elements having a negative center line offset in the second direction from its connected input line.

25. The circuit of claim 24 in which the combined effective height of the pair of neighboring switching elements is approximately 4 times the pitch.

26. An address encoder circuit comprising:
an address converter circuit that receives M-bit input signals indicating locations and, in response to each input signal, provides a respective N-bit address code, where N is less than M and at least as great as $\log_2 M$; each input signal having at most one asserted bit; for k=0 to ((M/2)−1), the respective N-bit address codes for input signals with (2k)th and (2k+1)th bits asserted being complementary; and
a recoding circuit that, in response to each input signal's respective N-bit address code, provides a recoded N-bit address code, the recoded N-bit address codes being an ordinal encoding of the input signals.

27. An address encoder circuit comprising:
an address converter circuit that receives M-bit input signals indicating locations and, in response to each input signal, provides a respective non-ordinal code having N bits, where N is at least $\log_2 M$; each input signal having at most one asserted bit; for k=0 to ((M/2)−1), the input signal with its (2k)th bit asserted having k as its respective non-ordinal code and the input signal with its (2k+1)th bit asserted having the complement of k as its respective non-ordinal code; and
a recoding circuit that, in response to the respective non-ordinal code of each input signal, provides a respective address code having N bits, the least significant bit of each address code being the most significant bit of the respective non-ordinal code; the (N−1) most significant bits of each address code being:
if the most significant bit of the respective non-ordinal code is "0", the (N−1) least significant bits of the respective non-ordinal code; and
if the most significant bit of the respective non-ordinal code is "1", the complement of the (N−1) least significant bits of the respective non-ordinal code.

28. An address converter circuit comprising:
M parallel, regularly spaced input lines that receive input signals indicating locations and N output lines that provide binary address codes, where M is equal to $2^N$; each input signal including at most one asserted bit; neighboring input lines being separated by a pitch;
for each of the input lines, a set of between zero and N NMOS transistors with gates connected to the input line, each of the transistors in the set being connected to pull down a voltage on one of the output lines when turned on by an asserted bit on the input line; while a bit is asserted on an input line, the output lines together providing a respective binary address code for the input line; for k=0 to ((M/2)−1), the input signal with its (2k)th bit asserted having k as its respective non-ordinal code and the input signal with its (2k+1)th bit asserted having the complement of k as its respective non-ordinal code; for each of the output lines, each of the transistors connected to the output line having at most one neighboring transistor connected to the output line; and
for each of the output lines, an output inverter that inverts the voltage on the output line to provide a respective address code bit;
a pair of the transistors being neighboring transistors connected to one of the output lines and with their gates connected to neighboring input lines; the pair of transistors having a combined effective height greater than twice the pitch; the pair of transistors having center lines that are offset differently from their connected input lines.

29. The circuit of claim 28 in which the combined effective height of the pair of transistors is approximately 4 times the pitch.

30. A method of converting signals, comprising:
obtaining M-bit input signals, where M is equal to 2N; each input signal including at most one asserted bit; and
converting each input signal to a respective N-bit code; the respective N-bit code for each input signal being unique and between zero and (M−1); for k=0 to ((M/2)−1), the respective N-bit codes for the input signals with their (2k)th and (2k+1)th bits asserted being complementary.

31. The method of claim 30 in which the input signals indicate locations and the respective N-bit codes are address codes.

32. A method of encoding addresses, comprising:
obtaining M-bit input signals indicating locations, each input signal having at most one asserted bit;
converting each input signal to a respective N-bit code, where N is less than M and at least as great as $\log_2 M$; for k=0 to ((M/2)−1), the respective N-bit codes for the input signals with their (2k)th and (2k+1)th bits asserted being complementary; and
recoding each input signal's respective N-bit code to an address code with N bits, the address codes being an ordinal encoding of the input signals.

33. The method of claim 32 in which M is equal to $2^N$.

34. A method of encoding addresses, comprising:
obtaining M-bit input signals indicating locations, where M is equal to $2^N$, each input signal including at most one asserted bit;

converting each input signal to a respective N-bit code;
for k=0 to ((M/2)−1), the input signal with its (2k)th bit asserted being converted to an N-bit code with value k and the input signal with its (2k+1)th bit asserted being converted to the complement of the N-bit code with value k; and recoding the respective N-bit codes to respective address codes with N bits, the least significant bit of each address code being the most significant bit of the respective N-bit code; the (N−1) most significant bits of each address code being:
if the most significant bit of the respective N-bit code is "0", the (N−1) least significant bits of the respective N-bit code; and
if the most significant bit of the respective N-bit code is "1", the complement of the (N−1) least significant bits of the respective N-bit code.

35. An integrated circuit comprising:
a substrate with a surface;
content addressable memory (CAM) circuitry formed at the substrate's surface, including:
a CAM array that stores a set of data items in locations, receives a search data item, and provides, for each location, a match signal indicating whether a data item satisfying a matching criterion is stored in the location;
priority encoder circuitry that, in response to the match signals for the locations, provides an M-bit priority signal with at most one asserted bit, an asserted bit indicating a set of one or more locations in the CAM array for which a match signal indicates that a stored data item satisfies the matching criterion; and
address converter circuitry that, in response to each M-bit priority signal, provides a respective N-bit address code, where N is less than M and at least as great as $\log_2 M$; the respective N-bit address codes together being a non-ordinal encoding of the M-bit priority signals; and
a recoder circuitry that, in response to the respective N-bit address code of each M-bit priority signal, provides a recoded N-bit address code; the recoded N-bit address codes of the M-bit priority signals together being an ordinal encoding of the M-bit priority signals.

36. The integrated circuit of claim 35 in which, for k=0 to ((M/2)−1), the respective address codes of the priority signals with their (2k)th and (2k+1)th bits asserted are complementary.

37. The integrated circuit of claim 35, in which the address converter circuitry comprises:
M input lines that receive the priority signals, and N output lines that provide the address codes; and
for each of the input lines, a set of between zero and N transistors with gates connected to the input line, each of the transistors in the set being connected to change a respective address code bit on one of the output lines when turned on by an asserted bit on the input line.

38. The integrated circuit claim 37 in which, for each output line, the transistors that change code bits on the output line are connected in a dynamic OR configuration.

39. The integrated circuit of claim 37 in which the transistors that change code bits on the output lines are NMOS transistors.

40. The integrated circuit of claim 37 in which one of the transistors has a neighboring transistor connected to the same output line, the transistor and the neighboring transistor having different offsets relative to the input lines to which their gates are connected.

41. An integrated circuit comprising:
a substrate with a surface;
content addressable memory (CAM) circuitry formed at the substrate's surface, including:
a CAM array that stores a set of data items in locations, receives a search data item, and provides, for each location, a match signal indicating whether a data item that satisfies a matching criterion is stored in the location;
priority encoder circuitry that, in response to the match signals for the locations, provides an M-bit priority signal with at most one asserted bit indicating a set of one or more locations in the CAM array for which a match signal indicated that a data item satisfied the matching criterion; the priority encoder circuitry including M parallel priority lines on which the M-bit priority signal is provided, the priority lines being uniformly spaced by a first spacing; and
address converter circuitry that, in response to each M-bit priority signal, provides a respective N-bit address code, where N is less than M and at least as great as $\log_2 M$; the address converter circuitry including:
M input lines, each input line being connected to a respective output line from the priority encoder, the input lines being uniformly spaced by approximately the first spacing;
N output lines extending approximately perpendicular to the input lines for providing output signals indicating converted addresses; and
switching elements for converting the priority signals to the output signals, each switching element connected to one of the input lines and one of the output lines; the switching elements connected to one of the output lines including a series of P switching elements connected to P consecutive input lines, P being two or more; the combined effective height of the P neighboring switching elements being greater than P times the first spacing; at least two of the neighboring switching elements having different offsets relative to their connected input lines.

42. The integrated circuit of claim 41 in which P is equal to two.

43. The circuit of claim 41 in which the combined effective height of the series of P switching elements is approximately 2P times the first spacing.

44. A system comprising:
a processor;
an integrated circuit connected for access by the processor, the integrated circuit including signal converter circuitry that includes:
first and second sets of lines extending respectively in first and second directions, the first and second directions being different; one of the first and second sets being input lines that receive input signals and the other being output lines that provide output signals; and
switching elements, each switching element controlling one of the output lines in response to one of the input lines; the output signals being converted versions of the input signals; a series of P of the switching elements being connected to one of the second lines and to P consecutive lines in the first set, P being two or more;
at least two switching elements in the series having different offsets in the second direction relative to their connected lines in the first set.

45. A system comprising:

a processor;

an integrated circuit connected for access by the processor, the integrated circuit including signal converter circuitry that includes:
input lines that receive input signals;
output lines that provide output signals; and
switching elements, each switching element controlling one of the output lines in response to an asserted input signal on one of the input lines; the switching elements that respond to an asserted input signal on one of the input lines together providing a respective output signal on the output lines that is converted from the asserted input signal; each switching element having at most one neighboring switching element controlling the same output line.

46. A system comprising:

a processor;

an integrated circuit connected for access by the processor, the integrated circuit including signal converter circuitry that includes:
input lines that receive input signals, each having at most one asserted bit;
output lines that provide codes; and
converting circuitry that responds to the input signals and provides the codes on the output lines; for each input line, the converting circuitry providing a respective code in response to an asserted bit on the input line; each input line's respective code being complementary with the respective code of one of the input line's neighboring input lines.

47. A system comprising:

a processor;

an integrated circuit connected for access by the processor, the integrated circuit including encoder circuitry that includes:
signal converter circuitry that receives input signals and, in response to each input signal, provides a respective code; the signal converter circuitry providing respective codes that together are a non-ordinal conversion of the input signals; and
recoding circuitry that, in response to each input signal's respective code, provides a recoded code, the recoded codes being an ordinal encoding of the input signals.

48. A router comprising:

receiving lines that receive data transmissions;

transmitting lines that retransmit data transmissions received on the receiving lines;

CAM circuitry that provides information used to retransmit data transmissions on the transmitting lines, the CAM circuitry comprising signal converting circuitry that includes:
first and second sets of lines extending respectively in first and second directions, the first and second directions being different; one of the first and second sets being input lines that receive input signals and the other being output lines that provide output signals; and
switching elements, each switching element controlling one of the output lines in response to one of the input lines; the output signals being converted versions of the input signals; a series of P of the switching elements being connected to one of the second lines and to P consecutive lines in the first set, P being two or more; at least two switching elements in the series having different offsets in the second direction relative to their connected lines in the first set.

49. A router comprising:

receiving lines that receive data transmissions;

transmitting lines that retransmit data transmissions received on the receiving lines;

CAM circuitry that provides information used to retransmit data transmissions on the transmitting lines, the CAM circuitry comprising signal converting circuitry that includes:
input lines that receive input signals;
output lines that provide output signals; and
switching elements, each switching element controlling one of the output lines in response to an asserted input signal on one of the input lines; the switching elements that respond to an asserted input signal on one of the input lines together providing a respective output signal on the output lines that is converted from the asserted input signal; each switching element having at most one neighboring switching element controlling the same output line.

50. A router comprising:

receiving lines that receive data transmissions;

transmitting lines that retransmit data transmissions received on the receiving lines;

CAM circuitry that provides information used to retransmit data transmissions on the transmitting lines, the CAM circuitry comprising signal converting circuitry that includes:
input lines that receive input signals;
output lines that provide, for each of the input signals, a respective code; and
converting circuitry that responds to the input signals and provides the codes on the output lines; for each input line, the converting circuitry providing a respective code in response to an asserted bit on the input line; each input line's respective code being complementary with the respective code of one of the input line's neighboring input lines.

51. A router comprising:

receiving lines that receive data transmissions;

transmitting lines that retransmit data transmissions received on the receiving lines;

CAM circuitry that provides information used to retransmit data transmissions on the transmitting lines, the CAM circuitry comprising address encoder circuitry that includes:
signal converter circuitry that receives input signals and, in response to each input signal, provides a respective code; the signal converter circuitry providing respective codes that together are a non-ordinal conversion of the input signals; and
recoding circuitry that, in response to each input signal's respective code, provides a recoded code, the recoded codes being an ordinal encoding of the input signals.

* * * * *